United States Patent
Bernstein

(10) Patent No.: US 7,969,228 B2
(45) Date of Patent: Jun. 28, 2011

(54) THERMAL SWITCH FOR INTEGRATED CIRCUITS, DESIGN STRUCTURE, AND METHOD OF SENSING TEMPERATURE

(75) Inventor: Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 12/488,821

(22) Filed: Jun. 22, 2009

(65) Prior Publication Data

US 2010/0321091 A1 Dec. 23, 2010

(51) Int. Cl.
*H01L 35/00* (2006.01)
*H01L 37/00* (2006.01)
*H03K 3/42* (2006.01)
*H03K 17/78* (2006.01)

(52) U.S. Cl. .......................... 327/513; 327/77

(58) Field of Classification Search .......... 327/512–513; 374/178

See application file for complete search history.

(56) References Cited

U.S. PATENT DOCUMENTS

| | | | |
|---|---|---|---|
| 4,253,391 A | | 3/1981 | Held |
| 4,924,212 A | * | 5/1990 | Fruhauf et al. ................ 340/598 |
| 6,198,337 B1 | * | 3/2001 | Matsuura ...................... 327/525 |
| 2006/0267127 A1 | * | 11/2006 | Kim .............................. 257/467 |
| 2008/0252360 A1 | * | 10/2008 | Yoshikawa .................... 327/512 |
| 2009/0010301 A1 | * | 1/2009 | Nagahisa .......................... 374/1 |

OTHER PUBLICATIONS

Ituero et al., "Leakage-based On-Chip Thermal Sensor for CMOS Technology", 2007, IEEE, pp. 3327-3330.

* cited by examiner

*Primary Examiner* — Quan Tra
(74) *Attorney, Agent, or Firm* — Richard Kotulak; Roberts Mlotkowski Safran & Cole, P.C.

(57) ABSTRACT

A single-ended thermal switch, design structure, and method of sensing temperature. A circuit includes a first MOS transistor and a second MOS transistor connected in series between a first power supply and a second power supply. The circuit apparatus also includes a signal conditioner connected to a node between the first and second MOS transistors. The first MOS transistor and the second MOS transistor are configured such that a leakage current of the second MOS transistor decreases a voltage of the node below a switch point of the signal conditioner when the temperature exceeds a threshold temperature.

21 Claims, 3 Drawing Sheets

THERMAL SWITCH FOR INTEGRATED CIRCUITS, DESIGN STRUCTURE, AND METHOD OF SENSING TEMPERATURE

FIELD OF THE INVENTION

The invention generally relates to temperature sensing and control of a semiconductor-based circuit and, more particularly, to a single-ended thermal cutout switch for digital application, a design structure of the same, and a method of sensing temperature.

BACKGROUND

Operating temperature has a significant influence on the operation of an integrated circuit (IC). For example, operating temperature can affect any or all of: the reliability, serviceability, useful lifetime, and the active and standby power characteristics of an integrated circuit (e.g., chip). Because of the influence of temperature on chip timing, reliability, and lifetime, it is not appropriate to allow microprocessors and logic chips to function above selected temperatures. Above selected temperatures, a processor's output may not be trustworthy, or else allowing the processor to continue to operate above a certain temperature may cause the processor to age prematurely or even self-destruct.

More specifically, temperature changes of a processor may change the performance of the transistors within the processor. For example, as temperature rises past a certain level, the transistors may begin to slow down. This changes the timing of the circuit, which may violate the timing conditions for the design of the circuit. Additionally, when the operating temperature becomes too high, the transistors may begin to suffer irreversible physical damage. This can render a chip inoperable, thereby limiting its useful lifetime.

Accordingly, there exists a need in the art to overcome the deficiencies and limitations described hereinabove.

SUMMARY

In a first aspect of the invention, there is a circuit apparatus for sensing a local temperature on an integrated circuit. The circuit apparatus includes a first MOS transistor and a second MOS transistor connected in series between a first power supply and a second power supply. The circuit apparatus also includes a signal conditioner connected to a node between the first and second MOS transistors. The first MOS transistor and the second MOS transistor are configured such that a leakage current of the second MOS transistor decreases a voltage of the node below a switch point of the signal conditioner when the temperature exceeds a threshold temperature.

In another aspect of the invention, there is a method of sensing a temperature of an integrated circuit. The method includes generating a binary signal from an analog voltage of a node between first and second MOS transistors connected in series between a first power supply and a second power supply. The binary signal is a first value when the temperature is less than or equal to the threshold temperature. The binary signal is a second value, different from the first value, when the temperature is greater than the threshold temperature.

In another aspect of the invention, there is a design structure tangibly embodied in a machine readable medium used for designing, manufacturing, or testing an integrated circuit. The design structure includes a first MOS transistor and a second MOS transistor connected in series between a first power supply and a second power supply. The circuit apparatus also includes a signal conditioner connected to a node between the first and second MOS transistors. The first MOS transistor and the second MOS transistor are configured such that a leakage current of the second MOS transistor decreases a voltage of the node below a switch point of the signal conditioner when the temperature exceeds a threshold temperature.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to temperature sensing and control of a semiconductor-based circuit and, more particularly, to a single-ended thermal cutout switch for digital application, a design structure of the same, and a method of sensing temperature. In embodiments, a thermal switch takes advantage of a fundamental temperature response of MOSFETs to determine when a particular operating temperature has been exceeded. Implementations of the thermal switch employ a low-power MOSFET circuit capable of detecting whether the temperature at the point on an IC at which the circuit is embodied is above or below a certain predefined temperature threshold. By utilizing the temperature response of the transistors within the circuit, the circuit can be used as a thermal switch for temperature sensing and control of an integrated circuit. For example, the output of the thermal switch can be used to turn off the clocks or power supply of a chip to prevent unreliable or destructive operation when the output indicates that the threshold temperature is exceeded.

In embodiments, two MOS transistors of identical type (e.g., either both N-type or both P-type) are arranged in series between two power supplies. A series of inverters are tied to an intermediate node between the two transistors. A first one of the transistors is connected (e.g., hardwired) in an "OFF" configuration, and a second one of the transistors is connected in a diode configuration. The transistors are sized such that their current carrying capacity changes as the operating temperature changes. When the operating temperature causes the leakage current of the OFF transistor to reduce (e.g., pull down) the voltage at the intermediate node in the series-connected stack, the series of inverters acts to amplify this and produce a binary indication of whether the leakage current has pulled down the voltage to a level below the switch point of a first one of the inverters. Since the current of the transistors is affected by temperature (i.e., the leakage current of the OFF transistor increases as the operating temperature increases, while the current of the diode-connected transistor decreases as temperature increases), a binary indication at the output of the series of inverters represents the operating temperature. A desired temperature threshold at which the binary output switches from one state to another may be set by selectively manufacturing the geometries of the respective transistors and inverters.

Figure 1:
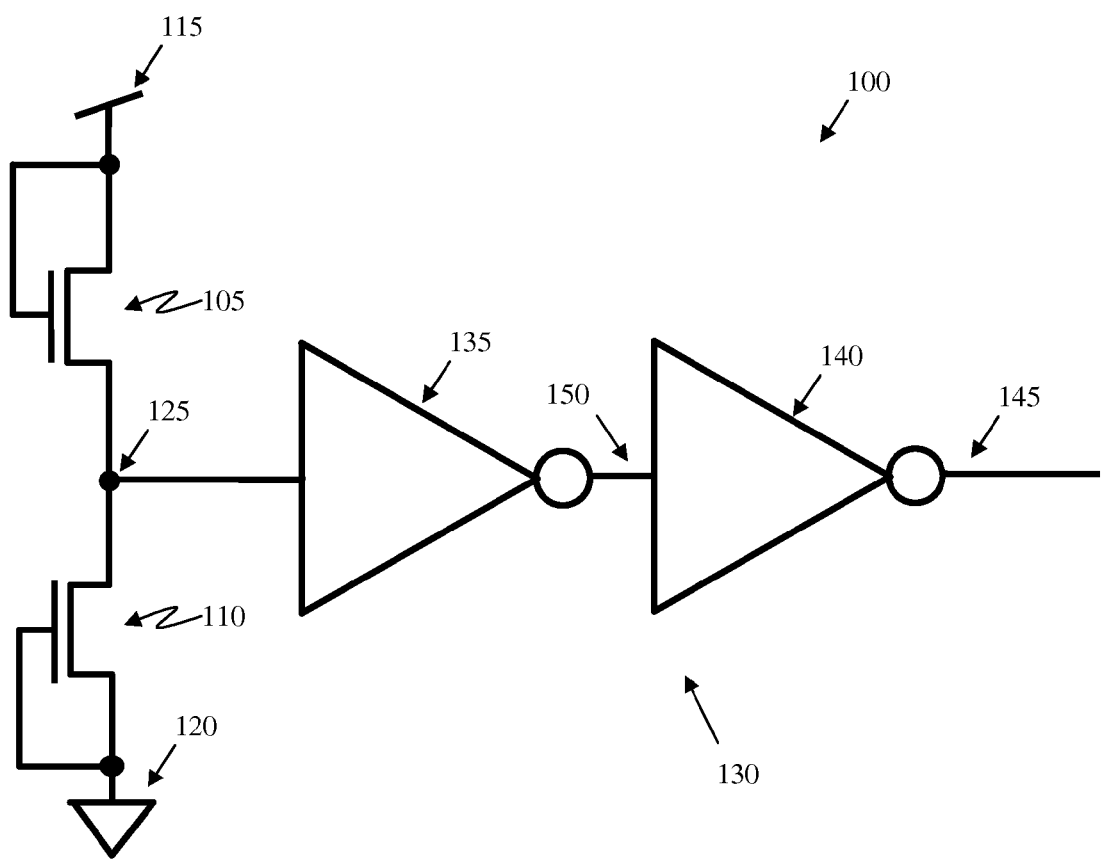
FIG. 1 shows a thermal switch in accordance with aspects of the invention.

FIG. 1 shows an embodiment of a thermal switch 100 in accordance with aspects of the invention. More specifically, FIG. 1 shows a thermal switch including a first NFET 105 and a second NFET 110 (e.g., first and second MOS transistors) connected in series between a first power supply 115 and a second power supply 120. In embodiments, the first power supply 115 corresponds to Vdd and the second power supply 120 corresponds to ground. However, the invention is not limited to this configuration, and the thermal switch can be arranged between any two suitable power lines.

According to aspects of the invention, the first NFET 105 is arranged in a diode configuration. That is, the gate and drain of the first NFET 105 are tied (e.g., electrically connected) to the first power supply 115, e.g., to Vdd. The source of the first NFET 105 is tied to an intermediate node 125. In accordance with further aspects of the invention, the second NFET 110 is arranged in a permanently OFF state. More specifically, the gate and source of the second NFET 110 are tied to ground, while the drain of the second NFET 110 is tied to the intermediate node 125.

In embodiments, a signal conditioner 130 is arranged in electrical connection with the intermediate node 125. The signal conditioner 130 may be any suitable circuit that can take the analog voltage at intermediate node 125 and digitize the signal (e.g., create a binary output). In a particular implementation, the signal conditioner 130 includes a first inverter 135 and a second inverter 140 that are arranged in series between the intermediate node 125 and an output 145. However, the invention is not limited to two inverters. Instead, any number of inverters (e.g., two, four, six, etc.) may be arranged in series in order to sufficiently digitize the signal from the analog voltage at intermediate node 125. Moreover, the invention is not limited to the use of inverters. Instead, the signal conditioner 130 may comprise any suitable circuitry for digitizing the signal to produce a binary output 145.

The components of the thermal switch 100 may be constructed in any suitable manner. For example, the first and second NFETs 105, 110 and the first and second inverters 135, 140 may be built monolithically in the same processes as the host chip in which the thermal switch 100 is embodied. Moreover, although the invention is described with respect to first and second NFETs 105, 110, the invention is not limited to implementations using NFETs. Instead, a first PFET arranged as a diode and a second PFET arranged in the OFF state could similarly be used in accordance with aspects of the invention.

In accordance with aspects of the invention, the thermal switch 100 is configured such that the value of the output 145 will be a first state (e.g., high, Vdd, 1, etc.) when the circuit is operating a temperature at or below a threshold temperature, and the value of the output 145 will be a second, opposite state (e.g., low, 0, etc.) when the circuit is operating a temperature above the threshold temperature. In embodiments, this is accomplished by constructing the first NFET 105 and the second NFET 110 such that their respective current carrying capacities change with the operating temperature. For example, the first NFET 105 (e.g., the diode-connected transistor) may be constructed with a long and narrow channel. In this manner, as the operating temperature rises, the majority carrier mean free path of the first NFET 105 deteriorates, which erodes the current through the first NFET 105. On the other hand, the second NFET 110 (e.g., the OFF transistor) may be constructed with a short and wide channel. In this manner, as the operating temperature rises, the barrier height of the second NFET 110 decreases, which increases the leakage current through the second NFET 110.

Accordingly, in embodiments, the current carrying capacity of the first NFET 105 decreases with increasing temperature while the current carrying capacity of the second NFET 110 increases with increasing temperature. Conversely, the current carrying capacity of the first NFET 105 increases with decreasing temperature while the current carrying capacity of the second NFET 110 decreases with decreasing temperature. Stated another way, the first NFET 105 is configured to have a current carrying capacity that is inversely proportional to the temperature, and the second NFET 110 is configured to have a current carrying capacity that is directly proportional to the temperature. In this manner, the analog voltage at intermediate node 125 varies based on the operating temperature. Particularly, the voltage at intermediate node 125 increases as the operating temperature decreases, and the voltage at intermediate node 125 decreases as the operating temperature increases.

In accordance with aspects of the invention, the first NFET 105, the second NFET 110, and the first inverter 135 are configured such that the voltage at intermediate node 125 substantially equals the switch point of the first inverter 135 at a predefined threshold temperature. In this manner, when the operating temperature is at or below the threshold temperature, the output 145 is at a first state (e.g., high, Vdd, 1, etc.). Conversely, when the operating temperature is above the threshold temperature, the output 145 is at a second state (e.g., low, 0, etc.). Accordingly, in implementations, the output 145 may be used to indicate whether the circuit is operating below or above the threshold temperature. As such, the thermal switch 100 may be used as a temperature protection circuit. For example, in embodiments, the output 145 may be used as a clock enable pin in local clock generation buffers. Additionally or alternatively, the output 145 may be used to disable any circuit (e.g., either locally or globally) that is threatened by high operating temperature.

In embodiments, the first inverter 135 is configured to have a relatively low β-ratio, and the second inverter 140 is configured to have a relatively high β-ratio. As used herein, the β-ratio of an inverter is defined as the ratio of: the aspect ratio of the inverter PFET to the aspect ratio of the inverter NFET, where aspect ratio is the ratio of the transistor channel width to channel length. Put another way, the β-ratio of an inverter may be defined by the following equation:

$$\beta\text{-ratio} = (PFET_{Aspect\ Ratio})/(NFET_{Aspect\ Ratio})$$

For example, the first inverter 135 may be arranged to have a β-ratio of about 1:1, and the second inverter 140 may be arranged to have a β-ratio of about 3:1. However, the invention is not limited to these values, and any suitable β-ratios may be used. By making the first inverter 135 have a low β-ratio, the first inverter 135 is sensitive to temperature-induced voltage changes at intermediate node 125. By making the second inverter 140 have a high β-ratio, the second inverter 140 amplifies the low output of the first inverter at node 150, thereby digitizing the signal to the binary output 145.

As described above, in embodiments, the first NFET 105 has a relatively long and narrow channel, while the second NFET 110 has a relatively short and wide channel. For example, for a 45 nm technology node integrated circuit, the first NFET 105 may have a channel length of about 450 nm and a channel width of about 45 nm (e.g., a length that is about ten times larger than the width), while the second NFET 110 has a channel length of about 45 nm and a channel width of about 450 nm (e.g., a width that is about ten times larger than the length). The invention is not limited to these values; instead, any suitable dimensions can be used for the first NFET 105 and the second NFET 110. In a preferred embodiment, the first NFET 105 is a high threshold voltage device and the second NFET is a low threshold voltage device, although the invention is not limited to this implementation.

Additionally, as described above, by appropriately selecting the respective dimensions of the first and second NFETs 105, 110 and the first inverter 135, the voltage at intermediate node 125 can be made to substantially equal the switch point of the first inverter 135 at a particular temperature (e.g., the threshold temperature). In this manner, a predefined threshold temperature may be selected by appropriately sizing the respective components of the thermal switch 100. In embodiments, the threshold temperature may be, for example, in the range of about 65° C. to about 100° C. However, the invention is not limited to a threshold temperature within this range, and any desired threshold temperature may be used.

In an exemplary embodiment, the first and second NFETs 105, 110 are sized such that the intermediate node 125 has a voltage of about 200 mv at an operating temperature of about 65° C. Also, the first inverter 135 is arranged to have a switch point at about 200 mv (e.g., input). In this manner, when the operating temperature of the system is below 65° C., the first NFET 105 has increased current and the second NFET has decreased current, such that the voltage at the intermediate node is greater than 200 mv. When the voltage at the intermediate node is greater than 200 mv (e.g., the switch point of the first inverter 135), the output of the first inverter 135 at node 150 is low, and the output of the second inverter 140 at output 145 is high. Thus, a high value at output 145 indicates a normal operating temperature (e.g., below the threshold operating temperature).

Conversely, still referring to the same exemplary embodiment, when the operating temperature is greater than 65°, the first NFET 105 has decreased current and the second NFET 110 has increased leakage current, such that the voltage at intermediate node 125 is pulled down by the leakage current to a value less than 200 mv. When the voltage at the intermediate node is less than 200 mv (e.g., the switch point of the first inverter 135), the output of the first inverter 135 at node 150 is high, and the output of the second inverter 140 at output 145 is low. Thus, a low value at output 145 indicates a high operating temperature (e.g., above the threshold operating temperature), and the high output 145 can be used to initiate remedial measures. For example, the output 145 may be connected to a digital disabler of clock of a microprocessor to shut off the microprocessor in the high temperature situation.

Figure 2:
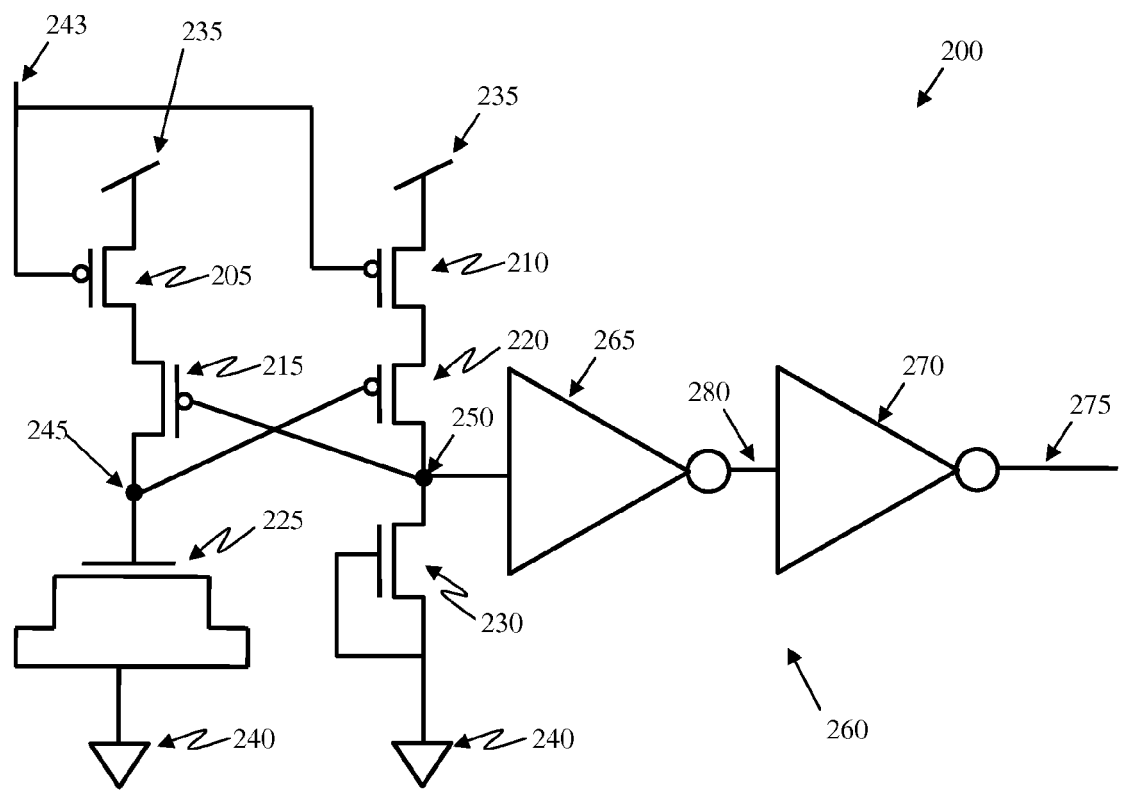
FIG. 2 shows a thermal switch in accordance with aspects of the invention.

FIG. 2 shows another embodiment of a thermal switch in accordance with aspects of the invention. More specifically, FIG. 2 shows a thermal switch 200 including a first PFET 205, second PFET 210, third PFET 215, fourth PFET 220, first NFET 225, and second NFET 230. In embodiments, the first PFET 205, third PFET 215, and first NFET 225 are arranged in series between a first power supply 235 (e.g., Vdd) and a second power supply 240 (e.g., ground). The second PFET 210, fourth PFET 220 and second NFET 230 are also arranged in series between the first power supply 235 and the second power supply 240.

In accordance with aspects of the invention, the gate of the first and second PFETs 205, 210 are tied to an evaluate line 243 that can be used to selectively turn the thermal switch 200 on and off. For example, when the signal carried by the evaluate line is low (e.g., ground), the first and second PFETs 205, 210 are turned on, such that the thermal switch 200 is turned on. Conversely, when the signal carried by the evaluate line is high (e.g., Vdd), the first and second PFETs 205, 210 are turned off, such that the thermal switch 200 is turned off. In embodiments, the first and second PFETs 205, 210 have a channel width of about 900 nm and a channel length of about 45 nm, such that they have a low resistance and are essentially transparent when the thermal switch 200 is turned on.

In embodiments, the first NFET 225 is configured as an inversion layer capacitor (e.g., the source and drain of the first NFET 225 are tied to ground), such that the first NFET 225 has little or no dependence on operating temperature. In this manner, the circuit comprising the first PFET 205, the third PFET 215, and the first NFET 225 constitutes a reference circuit. In embodiments, the first NFET 225 has a channel length and width of about 450 nm.

According to aspects of the invention, the second NFET 230 is configured in the OFF state, with its gate and source tied to ground. In this manner, the leakage current of the second NFET 230 increases as the operating temperature increases. In embodiments, the second NFET 230 is short and narrow, for example, having a channel length of about 45 nm and a channel width of about 450 nm. The second NFET 230 may be similar to the second NFET 110 described with respect to FIG. 1.

In embodiments, an intermediate node 245 (e.g., connected between the drain of the third PFET 215 and the gate of the first NFET 225) is tied to the gate of the fourth PFET 220. Also, an intermediate node 250 (e.g., connected between the drain of the fourth PFET 220 and the drain of the second NFET 230) is tied to the gate of the third PFET 215. The third and fourth PFETs 215, 220 may each be arranged as long narrow devices, for example, having a channel length of about 450 nm and a channel width of about 45 nm.

In accordance with aspects of the invention, a signal conditioner 260 is tied to the intermediate node 250. The signal conditioner 260 may be the same as, or similar to, the signal conditioner 130 described with respect to FIG. 1. For example, the signal conditioner 260 may comprise a first inverter 265 having a low β-ratio (e.g., 1:1) and a second inverter 270 having a high β-ratio (e.g., 3:1) arranged in series between the intermediate node 250 and an output 275.

Similar to the circuit described with respect to FIG. 1, the transistors of the thermal switch 200 may be selectively sized and constructed such that the output 275 is in a first state when the operating temperature is at or below a threshold temperature, and the output 275 is in a second state when the operating temperature is above the threshold temperature. Moreover, in embodiments, the first and second NFETs 225, 230 are sized to have a current comparable to ground at the threshold temperature.

In an exemplary mode of operation, the evaluate line 243 is set to low, which turns on the first and second PFETs 205, 210, which allows the voltage at intermediate nodes 245 and 250 to rise in accordance with the operating temperature. When the operating temperature decreases relative to the threshold temperature, the leakage current of the second NFET 230 decreases, causing the voltage at intermediate node 250 to increase. The increasing voltage at the intermediate node 250 moves the third PFET 215 toward the OFF state, which starves the intermediate node 245 for current, which causes the voltage at the intermediate node 245 to decrease. The decreasing voltage at the intermediate node 245 turns on the fourth PFET 220, which causes the voltage at node 250 to increase. Thus, as the operating temperature decreases relative to the threshold temperature, the voltage at node 250 increases, causing the value at node 280 to decrease, which causes the output 275 to go high.

Conversely, when the operating temperature increases relative to the threshold temperature, the leakage current of the second NFET 230 increases, pulling down (e.g., decreasing) the voltage at intermediate node 250. The decreasing voltage at the intermediate node 250 moves the third PFET 215 toward the ON state, which increases the current through the third PFET 215 and causes the voltage at the intermediate node 245 to rise. The increasing voltage at the intermediate node 245 turns off the fourth PFET 220, which starves node 250 for current, which causes the voltage at node 250 to decrease. Thus, as the operating temperature increases relative to the threshold temperature, the voltage at node 250 decreases, causing the value at node 280 to increase, which causes the output 275 to go low.

Accordingly, in embodiments, the thermal circuit 200 behaves in a bi-stable manner and may be utilized as a differential thermal lockout. For example, a low output 275, which is caused by the operating temperature increasing above the designed threshold temperature, may be used to disable a clock tree of the microprocessor.

Figure 3:
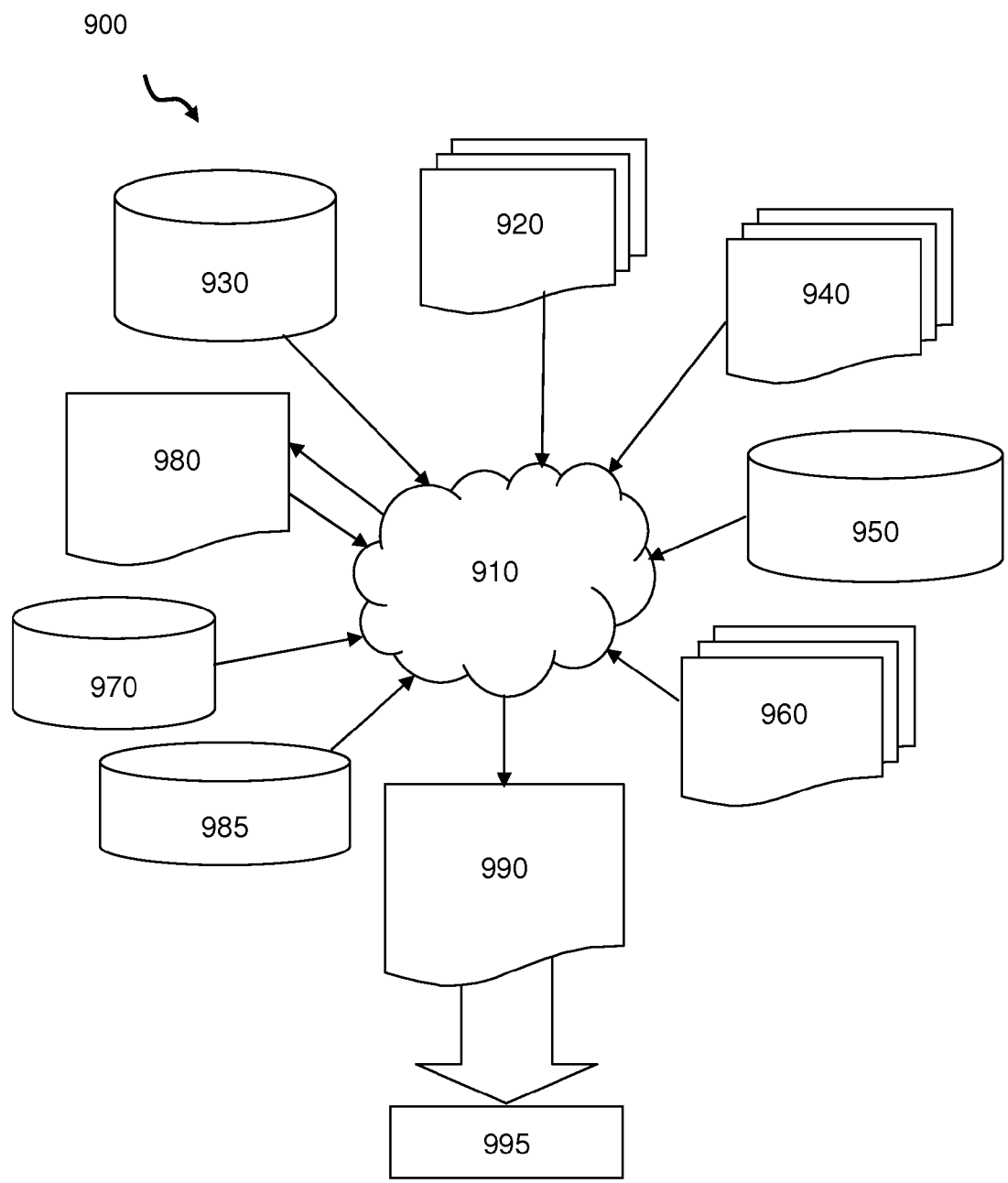
FIG. 3 is a flow diagram of a design process used in semiconductor design, manufacture, and/or test.

FIG. 3 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2. In one embodiment, design structure 990 may comprise a compiled, executable HDL simulation model that functionally simulates the devices shown in FIGS. 1-2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A circuit apparatus for sensing a local temperature on an integrated circuit, comprising:
   a first MOS transistor and a second MOS transistor connected in series between a first power supply and a second power supply; and
   a signal conditioner connected to a node between the first and second MOS transistors,
   wherein the first MOS transistor and the second MOS transistor are configured such that a leakage current of the second MOS transistor decreases a voltage of the node below a switch point of the signal conditioner when the temperature exceeds a threshold temperature, wherein
   the first MOS transistor comprises a first NFET arranged as a diode, and
   the second MOS transistor comprises a second NFET turned permanently off.

2. A circuit apparatus for sensing a local temperature on an integrated circuit, comprising:
   a first MOS transistor and a second MOS transistor connected in series between a first power supply and a second power supply; and
   a signal conditioner connected to a node between the first and second MOS transistors,
   wherein:
   the first MOS transistor and the second MOS transistor are configured such that a leakage current of the second MOS transistor decreases a voltage of the node below a switch point of the signal conditioner when the temperature exceeds a threshold temperature,
   the first MOS transistor comprises a first NFET having a gate and a drain connected to the first power supply and a source connected to the node, and
   the second MOS transistor comprise a second NFET having a gate and a source connected to the second power supply and a drain connected to the node.

3. The circuit apparatus of claim 2, wherein the signal conditioner comprises a plurality of inverters arranged in series.

4. The circuit apparatus of claim 3, wherein:
   the plurality of inverters comprises at least a first inverter and a second inverter,
   the first inverter comprises a first ft-ratio and a first input connected to the node,
   the second inverter comprises a second $\beta$-ratio, substantially higher than the first $\beta$-ratio, and a second input connected to an output of the first inverter.

5. The circuit apparatus of claim 2, wherein:
   the first MOS transistor has a channel length about ten times greater than a channel width, and
   the second MOS transistor has a channel width about ten times greater than a channel length.

6. The circuit apparatus of claim 1, wherein:
   the first power supply is Vdd, and
   the second power supply is ground.

7. The circuit apparatus of claim 1, wherein:
the first MOS transistor comprises a PFET having a source connected to the first power supply and a drain connected to the node, and
the second MOS transistor comprise an NFET having a gate and a source connected to the second power supply and a drain connected to the node.

8. The circuit apparatus of claim 7, further comprising a reference circuit including another PFET and another NFET arranged in series between the first power supply and the second power supply.

9. A circuit apparatus for sensing a local temperature on an integrated circuit, comprising:
a first MOS transistor and a second MOS transistor connected in series between a first power supply and a second power supply;
a signal conditioner connected to a node between the first and second MOS transistors,
wherein the first MOS transistor and the second MOS transistor are configured such that a leakage current of the second MOS transistor decreases a voltage of the node below a switch point of the signal conditioner when the temperature exceeds a threshold temperature; and
a reference circuit including another PFET and another NFET arranged in series between the first power supply and the second power supply, wherein:
the first MOS transistor comprises a PFET having a source connected to the first power supply and a drain connected to the node,
the second MOS transistor comprise an NFET having a gate and a source connected to the second power supply and a drain connected to the node,
the other NFET has a source and a drain connected to the second power supply,
the other NFET has a gate connected to another node between the other NFET and the other PFET,
the other node is connected to a gate of the PFET, and
the node is connected to a gate of the other PFET.

10. The circuit apparatus of claim 9, further comprising a switch that selectively connects and disconnects the PFET and the other PFET to the first power supply.

11. A method of sensing a temperature of an integrated circuit, comprising:
generating a binary signal from an analog voltage of a node between first and second MOS transistors connected in series between a first power supply and a second power supply,
wherein the binary signal is a first value when the temperature is less than or equal to the threshold temperature,
the binary signal is a second value, different from the first value, when the temperature is greater than the threshold temperature, and
the first MOS transistor comprises a first NFET arranged as a diode, and
the second MOS transistor comprises a second NFET which is turned permanently off.

12. The method of claim 11, further comprising disabling at least part of the integrated circuit when the binary signal is the second value.

13. The method of claim 11, further comprising selectively turning on a temperature sensing circuit comprising the first and second MOS transistors by applying an enabling signal to at least one other MOS transistor.

14. The method of claim 11, wherein the generating comprises conditioning the analog voltage through a plurality of inverters connected in series.

15. The method of claim 11, further comprising:
configuring the first MOS transistor to have a current carrying capacity that is inversely proportional to the temperature, and
configuring the second MOS transistor to have a current carrying capacity that is directly proportional to the temperature.

16. A design structure tangibly embodied in a machine readable medium used for designing, manufacturing, or testing an integrated circuit, the design structure comprising:
a first MOS transistor and a second MOS transistor connected in series between a first power supply and a second power supply; and
a signal conditioner connected to a node between the first and second MOS transistors,
wherein the first MOS transistor and the second MOS transistor are configured such that a leakage current of the second MOS transistor pulls a voltage of the node below a switch point of the signal conditioner when the temperature exceeds a threshold temperature, wherein
the first MOS transistor comprises a first NFET arranged as a diode, and
the second MOS transistor comprises a second NFET turned permanently off.

17. The design structure of claim 16, wherein the design structure comprises a netlist.

18. The design structure of claim 16, wherein the design structure resides on storage medium as a data format used for the exchange of layout data of integrated circuits.

19. The design structure of claim 16, wherein the design structure resides in a programmable gate array.

20. A method in a computer-aided design system for generating a functional design model of a thermal switch, the method comprising:
generating a functional representation of a first MOS transistor and a second MOS transistor connected in series between a first power supply and a second power supply;
generating a functional representation of a signal conditioner connected to a node between the first and second MOS transistors, wherein
the first MOS transistor and the second MOS transistor are configured such that a leakage current of the second MOS transistor decreases a voltage of the node below a switch point of the signal conditioner when the temperature exceeds a threshold temperature,
the first MOS transistor comprises a first NFET having a gate and a drain connected to the first power supply and a source connected to the node, and
the second MOS transistor comprise a second NFET having a gate and a source connected to the second power supply and a drain connected to the node.

21. A method in a computer-aided design system for generating a functional design model of a thermal switch, the method comprising:
a first MOS transistor and a second MOS transistor connected in series between a first power supply and a second power supply;
a signal conditioner connected to a node between the first and second MOS transistors,
wherein the first MOS transistor and the second MOS transistor are configured such that a leakage current of the second MOS transistor decreases a voltage of the node below a switch point of the signal conditioner when the temperature exceeds a threshold temperature; and
a reference circuit including another PFET and another NFET arranged in series between the first power supply and the second power supply, wherein:

the first MOS transistor comprises a PFET having a source connected to the first power supply and a drain connected to the node, the second MOS transistor comprise an NFET having a gate and a source connected to the second power supply and a drain connected to the node, the other NFET has a source and a drain connected to the second power supply, the other NFET has a gate connected to another node between the other NFET and the other PFET, the other node is connected to a gate of the PFET, and the node is connected to a gate of the other PFET.

\* \* \* \* \*